United States Patent [19]

Roy

[11] 4,260,428

[45] Apr. 7, 1981

[54] PHOTOVOLTAIC CELL

[75] Inventor: Pradip K. Roy, Wilmington, Del.

[73] Assignee: Ses, Incorporated, Newark, Del.

[21] Appl. No.: 127,358

[22] Filed: Mar. 5, 1980

[51] Int. Cl.³ .......................................... H01L 31/04
[52] U.S. Cl. ............................... 136/260; 204/38 B; 357/30; 427/74; 427/91
[58] Field of Search .................. 136/89 CD; 357/30; 427/74, 88, 89, 91; 204/38 B

[56] References Cited

U.S. PATENT DOCUMENTS

| 3,778,684 | 12/1973 | Fischer et al. | 357/16 |
| 3,888,697 | 6/1975 | Bogus et al. | 136/89 |

FOREIGN PATENT DOCUMENTS 48-24675  7/1973  Japan .................................. 136/89 CD

OTHER PUBLICATIONS

F. Pfisterer et al., "Improvement of Efficiency & Stability by Copper Treatment & Front Contacting of $Cu_xCdS$ Solar Cells," in Sun, Proceedings Int'l Solar Energy Society Congress, New Delhi, India, Jan. 1978, Pergamon Press (1978).

H. Matsumoto et al., "Stability & Mechanism of Degradation in $CdS-Cu_2S$ Ceramic Solar Cells," *Japan. J. Appl. Phys.,* vol. 15, pp. 1849-1850; (1976).

*Primary Examiner*—Aaron Weisstuch

[57] ABSTRACT

A photovoltaic cell having improved stability and lifetime comprising a cadmium sulfide film, an overlying copper sulfide film and deposited on the copper sulfide film, a film selected from the group consisting of a film of chromium, a film of chromium having deposited thereon a film of copper, a film of copper having deposited thereon a film of chromium and a film of an admixture of chromium and copper. A method for making such a photovoltaic cell is also disclosed.

16 Claims, 10 Drawing Figures

CHALC. DECAY KINETICS (MEMORY)

$f_{ch} = \exp(-kt^n)$ $f_{ch}$ = FRAC. CHALCOCITE k = RATE CONSTANT, DEFECT DEPENDENT (-log k ~ 2-5)

n = REACTION MECHANISM DEPENDENT CONSTANT (0.5-1)

PHOTOVOLTAIC CELL

BACKGROUND OF THE INVENTION

1. Field of the Invention

This invention relates generally to photovoltaic cells and a method for making them. More specifically, it relates to improvements in stability and lifetime of these cells. Such cells are useful for converting solar energy into electricity.

2. Background

Stability and degradation problems have long plagued $Cu_xS/CdS$ solar cells. These problems are intimately related, in part, to the stoichiometry of the copper sulfide layer. Stoichiometry, which is a phase sum of mainly two dominant phases (chalcocite and djurleite), is important as optimum efficiency is considered to be obtained when the copper sulfide layer is predominantly chalcocite ($Cu_xS$; $1.992 < X < 1.998$) phase. Efficiency is degraded as the copper sulfide is oxidized to a higher oxidation state of copper, for example, to djurleite ($Cu_{1.95}S$) or digenite ($Cu_{1.7}S$). Several intrinsic mechanisms are thought to contribute to the degradation of the desired chalcocite phase to other phases causing the cells to gradually reduce their electrical output with time. Oxidation by external media as well as by copper migration through the layer via dislocation, stacking faults, subgrain boundaries and similar defects are thought to contribute to the chalcocite phase degreadation. Light and moisture are the dominant culprits in the chalcocite phase decay. Elevated temperature can enhance degradation.

U.S. Pat. No. 3,888,697 issued June 10, 1975 to Bogus et al obtains an improvement in stoichiometry of the cuprous sulfide layer by depositing on the copper sulfide layer an additional layer of copper metal. Presumably, the excess copper metal reduces any higher oxidation state copper present to produce chalcocite without altering defect-dominated chalcocite decay kinetics called the "memory effects" in $Cu_xS/CdS$. The application of an additional chromium layer as provided by the instant invention provides prolonged chalcocite stability and a change in the built-in memory of $Cu_xS/CdS$ cells.

Japanese Pat. No. 4,824,675 issued July 23, 1973, to Hamaski purports to stabilize the properties of a solar cell by preventing oxidation of the copper ion by an electric current of excessive amperage, as may occur when the cell is in the short circuited condition or under heavy load, by adding a small quantity of metallic iron to the copper sulfide. Presumably, the metallic iron acts similar to metallic copper in being oxidized in preference to the cuprous sulfide.

Metallization of the copper sulfide layer by chromium of the instant invention has a three-fold purpose, (1) Chalcocite phase stabilization in the copper sulfide layer
(2) Throttlement of defect induced copper electromigration, and
(3) Formation of a coherent, passive oxide $Cr_2O_3$ layer which protects relatively unstable chalcocite from ambient.

SUMMARY OF THE INVENTION

This invention essentially comprises a cadmium sulfide-copper sulfide photovoltaic cell having improved stability. This improvement in stability is obtained by depositing a film of chromium or various combinations of chromium with copper over the copper sulfide. The chromium layer stabilizes the chalcocite phase of the copper sulfide, providing sustained high efficiencies under prolonged light and moisture exposure; it reduces copper electromigration which reduces cell degradation under high current loading conditions, and also provides physical protection to the cell against the external environment. Thus, the application of a layer of chromium provides several improvements over the prior art: (i) chalcocite phase stabilization probably by elimination of any soft phonon modes; (ii) throttlement of copper electrotransport via defect paths by reducing the effectiveness of these paths by pinning them and inhibiting their multiplications; and (iii) instantaneous formation of a thin passive and coherent oxide layer ($Cr_2O_3$) (not the case for either copper or iron oxide), which being a poor vacancy source will reduce the localization of point defects near the surface and thus reduce lateral copper electrotransport, in addition to the protection of the relatively unstable chalcocite from ambient.

DESCRIPTION OF THE PREFERRED EMBODIMENTS

The use of a cadmium sulfide-copper sulfide photovoltaic cell is well known in the art. This type of cell is used, for example, as a solar cell. Since each cell generates only a small amount of power, usually much less power than is required for most applications, the desired voltage and current is realized by interconnecting a plurality of solar cells in a series and/or parallel matrix. This matrix is generally referred to as a solar cell array. As used herein the term "photovoltaic cell" includes within its definition such arrays of cells as well as the individual cells. Illustrative of such arrays are U.S. Pat. No. 3,483,038 issued Dec. 9, 1969, U.S. Pat. No. 3,571,915, issued Mar. 23, 1971 and U.S. Pat. No. 4,127,424, issued Nov. 28, 1978, incorporated by reference herein.

The photovoltaic cells of the instant invention and the method of making them are conventional and described in the art except for applicant's improvement of applying a chromium film to the copper sulfide layer prior to adding a collecting electrode. Typical of such prior art cells is that of Carlson et al, U.S. Pat. No. 2,820,841, issued Jan. 21, 1958, (incorporated herein by reference) one of the earliest patented cadmium sulfide-copper sulfide cells. The cell is further illustrated in FIG. 1. Layer (11) is typically a supportive substrate made of, for example, glass, ceramic, metal, or plastic. For purposes of illustration, a non-conductive substrate is shown to which is attached conductor electrode (12), cadmium sulfide layer (13) and copper sulfide layer (14). Next is applicant's improvement comprising a chromium-containing layer (15), followed by a collector electrode (16).

The photovoltaic cell may be either a front-wall cell, a backwall cell or a combination of both. In a front-wall cell, light enters the absorber, which in this case is the cuprous sulfide layer. For this type of cell the collector electrode must allow light to pass through it and is usually a grid of electrically conductive metal such as gold or copper. Therefore, the chromium layer convering the cuprous sulfide must be thin enough not to absorb excessive amounts of light. For a front-wall cell, the conductor electrode attached to the cadmium sulfide layer and the substrate is not required to be transparent. Illustrative of front-wall cells is U.S. Pat. No. 4,127,424, issued Nov. 28, 1978, incorporated by reference.

For a back-wall cell the substrate and the conductor electrode attached to the cadmium sulfide layer must be transparent, as the cadmium sulfide layer is exposed to the light. Thus, the chromium layer and the electrode for the cuprous sulfide need not be transparent. Typically, the substrate for back-wall cell is transparent glass or plastic and the electrode for the cadmium sulfide layer is conductive tin oxide, indium oxide or mixtures thereof. Illustrative of a back-wall cell is U.S. Pat. No. 4,143,235, issued Mar. 6, 1979, incorporated by reference herein.

The cell may also be a combination of a front-wall and a back-wall cell as illustrated by U.S. Pat. No. 3,376,163 issued Apr. 2, 1968, incorporated by reference. In this case, the substrate, chromium layer, and both electrodes must be transparent.

The key aspect of the instant invention is the application of a chromium-containing layer to the copper sulfide. This is denoted as layer 15 in FIG. 1. This chromium-comprising layer (15) is applied as the metal in any conventional fashion such as by evaporation, sputtering, ion-plantation, etc, electrolytically, or chemically as by electroless plating. Because of the thinness of the chromium-comprising layer and the strong oxygen-gettering ability of chromium, the chromium will be present in the chromium-comprising layer as primarily the oxide ($Cr_2O_3$), having been converted to the oxide during either the application process or, desirably, the oxidation is affected later by heating in air. The remaining chromium segregates preferentially around energetically favorable defect sites, preventing their multiplication and propagation.

Figure 2:
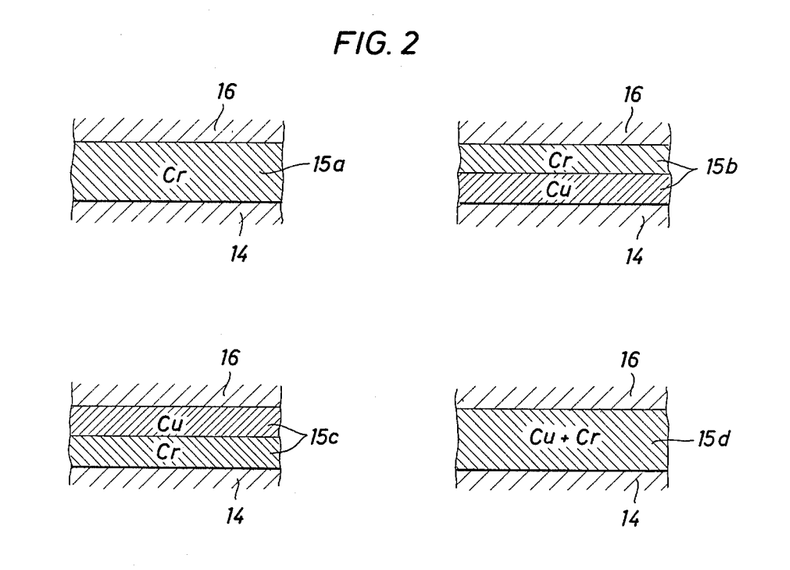
FIG. 2 shows various embodiments of the chromium layer 15 of FIG. 1.

FIG. 2 illustrates various embodiments of the chromium comprising layer. Layer (15a) represents the application of primarily a chromium-comprising layer. Layer (15b) represents first the application of a copper layer as exemplified by U.S. Pat. No. 3,888,697 issued June 10, 1975 to Bogus et al, incorporated by reference, followed by the application of the chromium-comprising layer. Layer (15a) reverses the process of layer (15b). The copper is applied in any conventional fashion; evaporation, chemical, electrolytic. Layer (15d) illustrates the simultaneous application of chromium and copper, producing an intimate mixture thereof. The chromium-comprising layer will typically range from about 8 to about 15 angstroms for front-wall cells and from about 10 to about 25 angstroms for back-wall cells. For the composite layer, copper on chromium or chromium on copper, the chromium layer will range between about 8 and about 15 angstroms and the copper layer will range from about 50 to about 100 angstroms for a front wall cell. For the back-wall cell the chromium will range from about 10 to about 25 angstroms with ano critical limit on the copper although it will typically range from about 50 to about 100 angstroms. For the layer comprising a mixture of copper and chromium, the layer will range in thickness from about 50 to about 100 angstroms for front-wall cells and from about 75 to about 100 angstroms for a back-wall cell. There are two basic limitations on the thickness of the chromium-comprising layer. First, when light must pass through this layer, it must be thin enough not to absorb excessive amounts of light, particularly on the shorter wave lengths (blue region) where it is found to have a higher absorption coeffecient. Secondly, the chromium-comprising layer should not be so thick as to provide excessive electrical resistance between the copper sulfide layer and the collector electrodes.

A preparation of a photovoltaic cell illustrative of the instant invention is described below: other variations will be apparent to one skilled in the art.

Figure 1:
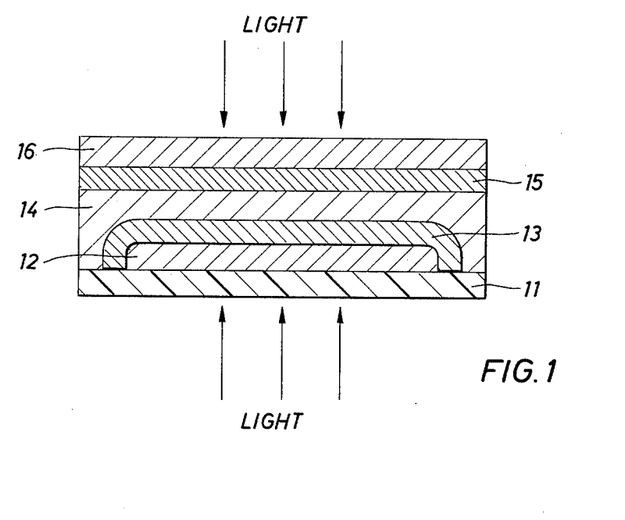
FIG. 1 is a cross-sectional view of a photovoltaic cell of the invention. This cross-sectional view is not to scale since it would not be practical to show in a drawing the true thickness of the various elements of the cell.

The first step in forming a cell having a non-conductive substrate is to coat the substrate 11 (see FIG. I) with a conductive layer to form the conductor electrode 12. Typical substrates include plastics, or ceramics. Various substrates are disclosed in U.S. Pat. No. 3,483,038; U.S. Pat. No. 3,376,163; and in U.S. Pat. No. 4,127,424 noted above. The conductor electrode or conductive layer typically comprises a conductive metal such as zinc or silver or a conductive ceramic as described in U.S. Pat. No. 4,127,424 noted above. More than one layer of metal may be deposited on the substrate if desired (e.g. Cu-Zn, or brass). In some cases a metal substrate may be used which also serves as the conductor electrode, e.g. a molybdenum substrate may serve as the electrode. In addition, a thin film of an electrically conductive metal such as zinc may be applied to the electrode to provide ohmic contact.

Upon this conductor electrode a semiconductor material such as cadmium sulfide film 13 is deposited. This can be done in a known manner, such as through a suitably apertured mask from the vapor state. The thickness of the layer may be about 20 microns to about 100 microns, as disclosed in U.S. Pat. No. 3,186,874, issued June 1, 1965, incorporated herein by reference. The cadmium sulfide film 13 typically covers and completely overlaps all but a small portion of the bottom electrode. The uncovered portion can be used subsequently either for electrical connecting means to an adjacent cell, such as the top electrode of an adjacent cell to make a series connection therewith, or for a negative output terminal. When the substrate is insulating, as shown, the cadmium sulfide film 13 in each of the cells typically overlaps the remaining periphery of the conductor electrode and extends to the surface of substrate 11 in order that the subsequent overlapping films and the collector electrode in each cell do not contact the bottom electrode layer 12.

The surface of the cadmium sulfide film 13 may be etched with hydrochloric acid for about 4–5 seconds, if desired, before the cuprous sulfide film is formed therein, as described in U.S. Pat. No. 3,480,473 issued Nov. 25, 1969, incorporated by reference herein. The cuprous sulfide film 16 is formed in a suitable fashion such as, for example, deposition from the vapor state through a suitably apertured mask over the cadmium sulfide film 13, or by contacting the cadmium sulfide film 13 with an aqueous solution of a cuprous salt as, for example, a cuprous chloride or bromide or iodide solution, as described in Keramidas, U.S. Pat. No. 3,374,108 issued March 19, 1968, incorporated by reference herein. The cuprous sulfide film 24 may have a thickness between about 1000 Å and about 10,000 Å.

Following the depositions of cadmium sulfide and copper sulfide layers, the cell is subjected to a heat treatment usually at a temperature of from about 100° C. to about 300° C., which activates the p-n junction. The heat treatment may be provided right after deposition of the copper sulfide, in which case the heat treatment must be carried out in vacuum, but more conveniently it is carried out after deposition of the chromium layer or after the cell has been gridded or encapsulated, in which case it may be carried out in air as well as in vacuum. Combinations of the above may be used. (See FIG. 3 for process flow diagram.)

After the copper sulfide film is produced, the chromium comprising layer is added in a traditional fashion; vacuum evaporation, chemically or electrolytically. Vacuum deposition is preferred. Vacuum deposition systems are readily available commercially to carry this step. When copper is also deposited, it is also done conventionally, i.e., vacuum deposition, chemically or electrolytically. Vacuum or electrolytic deposition is preferred for copper.

After the chromium layer is added, a collector electrode is affixed. The collector electrode can suitably be any materal of high electrical conductivity. Suitable materials are, for exemple, gold, platinum and copper. For front-walled cells, it must allow or be shaped to allow passage of light. Such electrodes are known in the art. The collector electrode may be provided in any manner such as by deposition through a suitbly apertured mask from the vapor state. Alternatively, the top electrode may be vapor deposited or screened onto a flexible insulating film such as Mylar, Aclar or TFE and then the film pressed into the cell with the collector electrode in ohmic contact with the chromium-comprising layer and held in place with a light transmissive adhesive. The collector electrode can also be a grid, or mesh, of fine metal wire.

The finished cell assembly is then usually sealed or encapsulated with a protective light transmitting coating or a protective film or plate of a material such as glass, plastic or the like. The protective film should be impervious to oxyen and water vapor which would degrade the cell.

Figure 3:
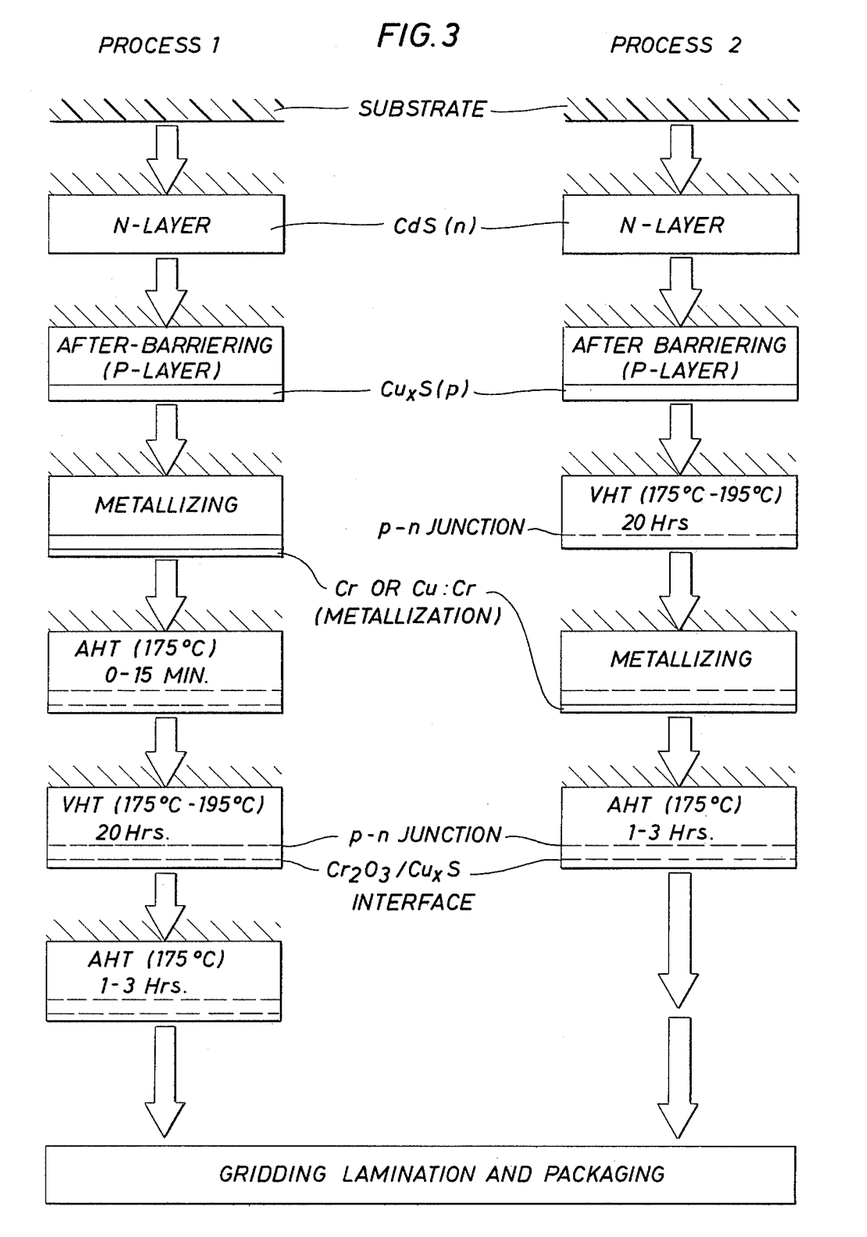
FIG. 3 shows various processing flow diagrams for chromium (or copper-chromium) metallization of the p-layer and heat treatments.

Two typical schematic flow diagrams for the preparation of cells using the chromium metallization of the instant invention are shown in FIG. 3. Process 1 shows the laying down of the n-layer on the substrate, followed by the p-layer and then the chromium-containing layer. This is followed by a series of heat treatments in air, vacuum and then air, followed by the gridding, lamination and packaging. Process 2 differs from 1 in that after barriering, the cell is vacuum heat treated, then chromium metallized and then air heat treated, followed by gridding, lamination and packaging. Analysis by optical transmission and chemical analysis showed the chromium-layer to range from about 50–100 Å in all metallizing treatments.

The preparation of the cells of this invention and the improvement accruing therefrom are illustrated by the following illustrative embodiments which are provided for illustration and are not to be construed as limiting this invention.

Figure 4:
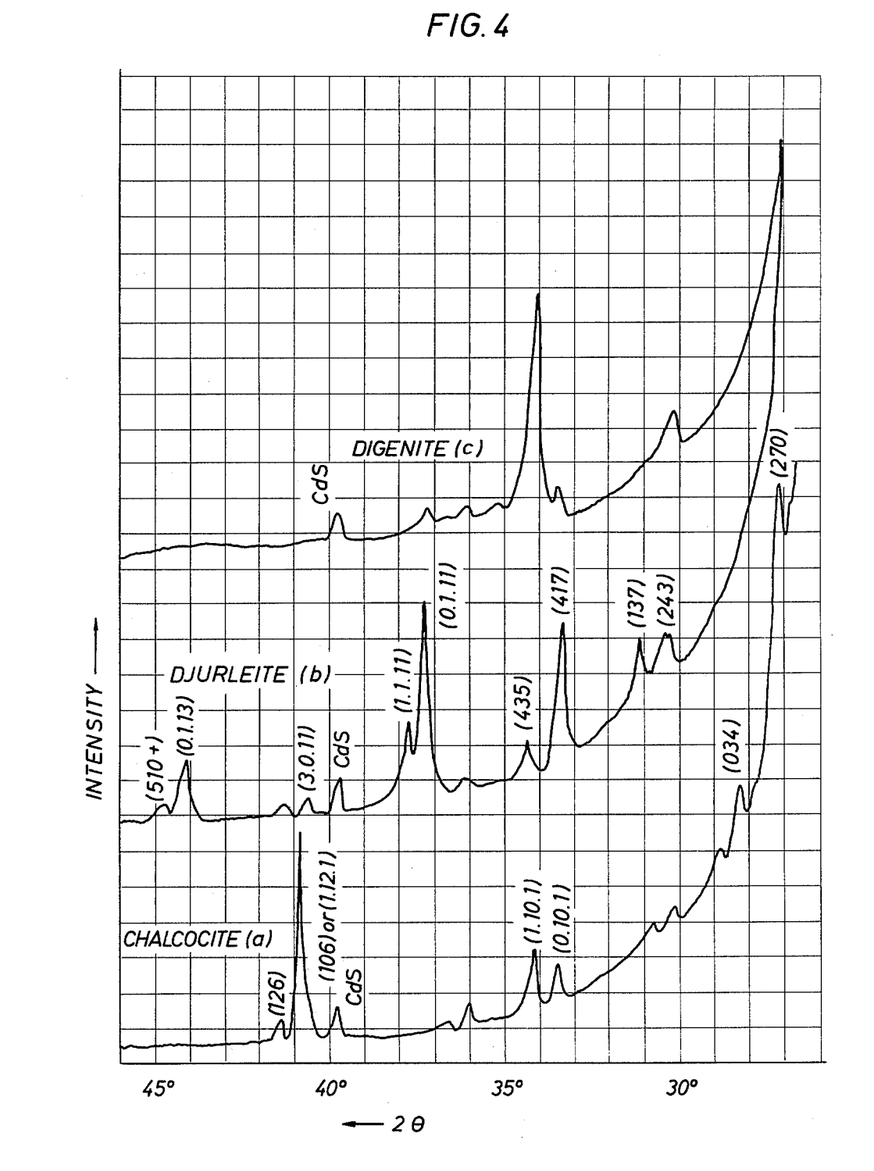
FIG. 4 shows preferred orientation indicating dominant Bragg reflections of the copper sulfide layer on C-axis oriented cadmium sulfide for the p-layer having 100 percent (a) chalcocite, (b) djurleite and (c) digenite, respectively.

Illustrative Embodiment (i) X-Ray Diffraction Analyses of Various Phases of $Cu_xS$ on C-axis Oriented CdS FIG. 4 shows the Bragg scans of the p-layer on the $Cu_xS$/CdS heterostructure. FIG. 4(a) indicates when the $Cu_xS$ layer is ~100% chalcocite. Preferred orientation of the p-layer on the oriented CdS is self-explanatory. Most of the dominant reflections are on the low angle side ($25° < 2\theta < 42°$). Absence of other reflections as observed in bulk chalcocite is due either or preferred orientation and/or buried under strong CdS peaks. FIG. 4(b) shows an XRD scan of the p-layer when the system is ~100% djurelite on oriented CdS. (This is equivalent to x=1.93.) Again, the dominant reflections are on the low angle side ($30° < 2\theta < 45°$). Miller indices were evaluated using both orthohombic and monoclinic indexing for chalcocite and djurleite. The p-layer in the $Cu_xS$/CdS system was completely converted to digenite (x~1.75) by exposing the nude cells to a high humidity atomsphere for over 40 hours or submerging them in $H_2O$ at room temperature for a few hours. Relevant Bragg reflections of digenite on oriented CdS are shown in FIG. 4(c).

(ii) Chalcocite Decay Kinetics—Memory Effects in $Cu_xS$/CdS Heterostructure

Chalcocite→djurleite phase transformation occurs by the process of nucleation and growth on energetically favorable sites obeying the kinetic law:

$$f_{dj} = 1 - \exp[-K(p_\perp, T)t^n] \tag{1}$$

where $f_{dj}$ is the fraction of transformed djurleite in the chalcocite matrix in time "t".

$$f_{dj} + f_{ch} = 1 \tag{2}$$

$K(\rho_\perp, T)$—effective time independent rate constant (defect density and temperature dependent)

n—experimentally determined reaction mechanism dependent constant $f_{ch}(t)$—can be defined in terms of integrated intensities of (106) Bragg reflection with respect to $t_o$ as:

$$f_{ch}(t) = \frac{I_{(106)}(t_o) - I_{(106)}(t)}{I_{(106)}(t_o)}$$

and similar equations exist for "$f_{dj}$". Using 1 and 2, one can obtain:

$$\log \log (1/f_{ch}) = n \log t + \log K \quad (3)$$

Figure 5:
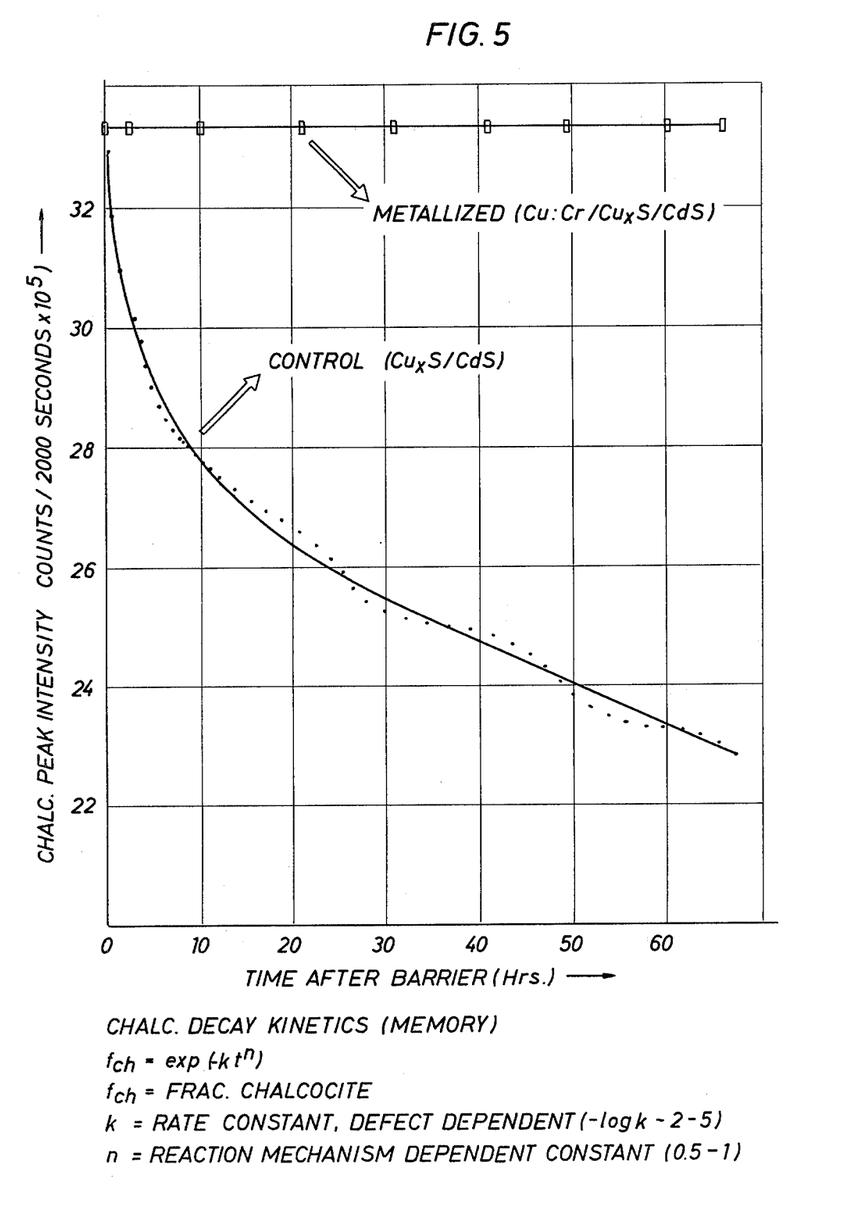
FIG. 5 shows the time dependence of the chalcocite phase decay in the p-layer in $Cu_xS/CdS$ heterostructure and the effects of chromium metallization of $Cu_xS$ in throttling the decay.

Initial decay kinetics indicate $n \sim 0.5-0.95$ and $-\log K \sim 2-5$ in $Cu_xS/CdS$ heterostructure. The effects of chromium metallization of $Cu_xS$ in suppressing chalcocite decay are indicated in FIG. 5. The built in memory in $Cu_xS/CdS$, which governs the chalcocite decay kinetics, constitutes (i) initial defect concentration in CdS (substrate and/or thermally induced),
(ii) defect generations for lattice accommodation during topotaxy, and
(iii) state of stress and stress-induced defect multiplications.

Figure 6:
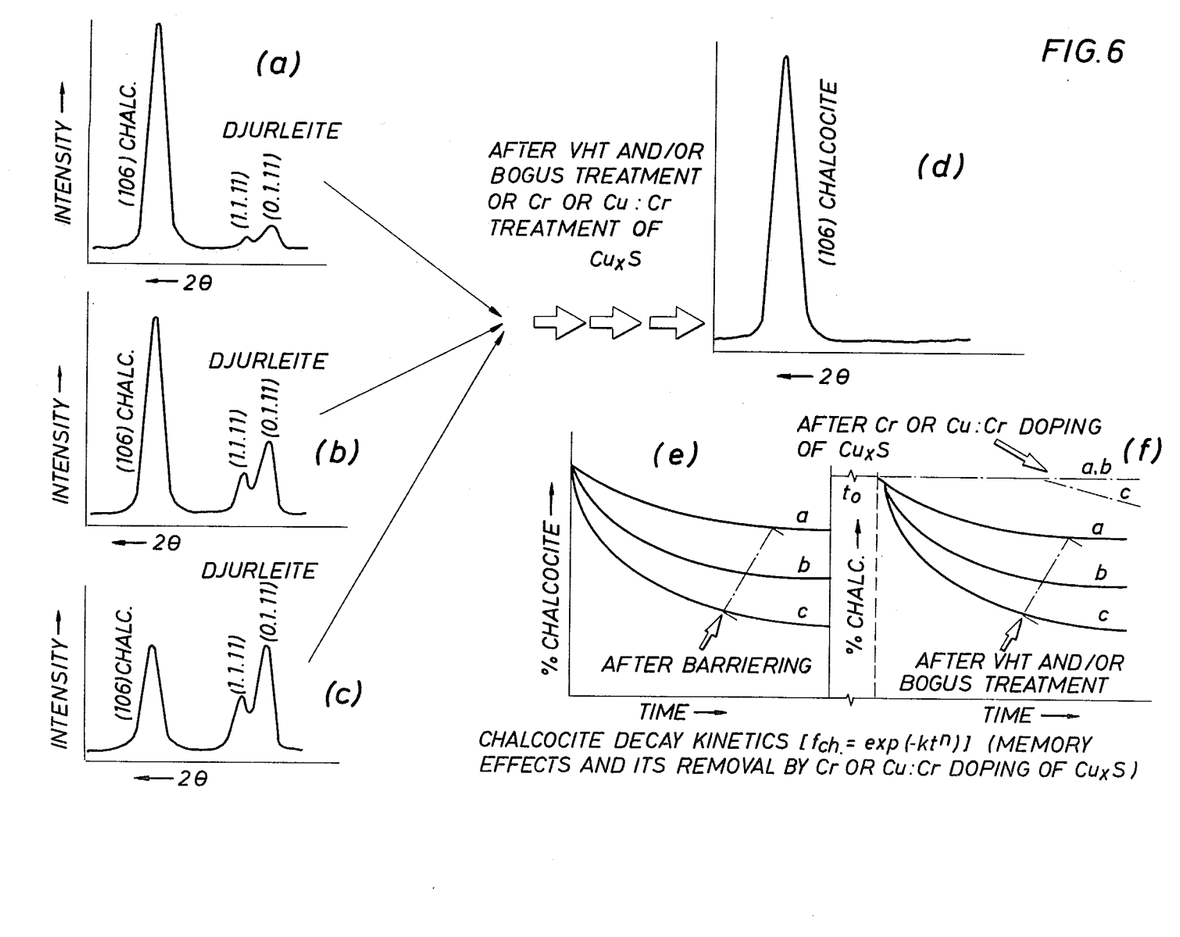
FIG. 6 shows the effects of heat treatments, copper treatments and chromium metallization of the p-layer (d) with various initial stoichiometries (a, b and c) on chalcocite decay kinetics (e and f) describing the "memory" of the $Cu_xS/CdS$ system and its elimination by chromium metallization.

FIG. 6 (a, b and c) shows $Cu_xS/CdS$ with varying degrees of initial djurleite concentrations and chalcocite decay rates (e) are converted to 100% chalcocite (d) after a conventional vacuum heat treatments (VHT) and/or copper (Bogus) treatment retained their "memories" whereas chromium (with or without copper) changes dramatically the chalcocite decay kinetics and "memory" in the $Cu_xS/CdS$ heterostructure (FIG. 6(f)).

(iii) Effects of P-layer Metallization on Substructural and Lattice Properties of the Cadmium Sulfide X-ray crystallite size, microstrain distribution and defect analyses (faults and dislocations) were ascertained from Fourier deconvolution of Bragg profiles for both basal and nonbasal reflections using thermally recrystallized CdS as a standard. Accurate lattice parameters "c" and "a" were obtained from the peak positions of basal and nonbasal reflections after various stages of processing, including Cr or Cu:Cr metallization of the p-layer.

Lattice Properties (a) There are contractions in both "c" and "a" without altering the c/a ratio after every stage of processing with major changes occurring during etching and barriering (E & B) towards the recrystallized (CdS) value.

(b) CdS basal peak shift occurs towards the higher Bragg angles after E-B, indicative of the state compression of the basal planes. $Cu_xS/CdS$ with relatively good memory shows a smaller basal peak shift than that of the system with a bad memory.

(c) The lattice parameter "c" gets drastically reduced by chromium (with or without copper) metallization of $Cu_xS$ without significantly affecting "a", thus reducing the "c/a" ratio substantially towards the ideal value of 1.61872 (recrystallized CdS or (002)—oriented single crystal value).

(d) The "memory effects" have no substantial influence on the absolute values of c and a; however, the c/a ratio for a system with good memory is closer to the "c/a" ratio of a recrystallized CdS than that of a system with bad memory.

| Structural/Substructural Parameters* | CdS As Deposited | Effects of Processing CdS After 6 Secs. Etch & 20 Secs. Barrier | CdS After E & B VHT (175° C., 20 hrs.) | Cu:Cr-Cu$_x$S/CaS After Heat Treatment |
|---|---|---|---|---|
| "c" in Å | 6.72333 | 6.71909 | 6.71886 | 6.71859 |
| "a" in Å | 4.13739 | 4.13267 | 4.12815 | 4.13796 |
| "D$_{av.}$" in Å (Basal Crystallite Size) | 1487 | 919 | 984 | 475 |
| RMS strain × 10$^{-4}$ $<\epsilon^2>_{004}{}^{\frac{1}{2}}$, L = 100 Å | 8.619 | 9.932 | 8.581 | 8.718 |
| Av. Strain × 10$^{-4}$ $<\epsilon>_{004}$, L = 100 Å | 1.764 | 2.596 | 2.815 | 8.62 |
| D$_{eff}$[(105), (107)] (Nonbasal Crystallite Size) | 225 | 227 | 240 | 210 |
| D$_{eff}$[(106), (108)] (Nonbasal Crystallite Size) | 162 | 160 | 170 | 140 |
| $\alpha$(× 10$^{-3}$) (Deformation Stacking Fault Probabilities) | 6.9 | 5.8 | 7.5 | 5.95 |
| $\beta$(× 10$^{-3}$) (Growth Stacking Fault Probabilities) | 5.9 | 6.4 | 6.3 | 1.23 |
| $\rho$ (cm · cm$^{-3}$) (004), $\perp$ L = 100 Å (Basal Dislocation Densities) | 2.555 × 10$^{11}$ | 4.769 × 10$^{11}$ | 3.852 × 10$^{11}$ | 8.088 × 10$^{11}$ |

*Memory = 40% Djur. After 7 Days.

(e) The basal crystallite size "D"$_{av.}$ and $$<\epsilon^2>{}^{\frac{1}{2}}_{004}$$

(rms strain) get continually reduced during etching, barriering and heat treatments with major changes occurring during the etching and barriering operation. The nonbasal, fault-affected crystallite size, faulting probabilities and energies do not change significantly after every stage of processing.

(f) P-layer metallization by chromium (with or without copper) causes a small increase in basal average strain dislocation densities and a reduction in basal crystallite size and stacking fault probabilities.

(iv) Nature of Metallized Chromium Comprising Layer

Figure 7:
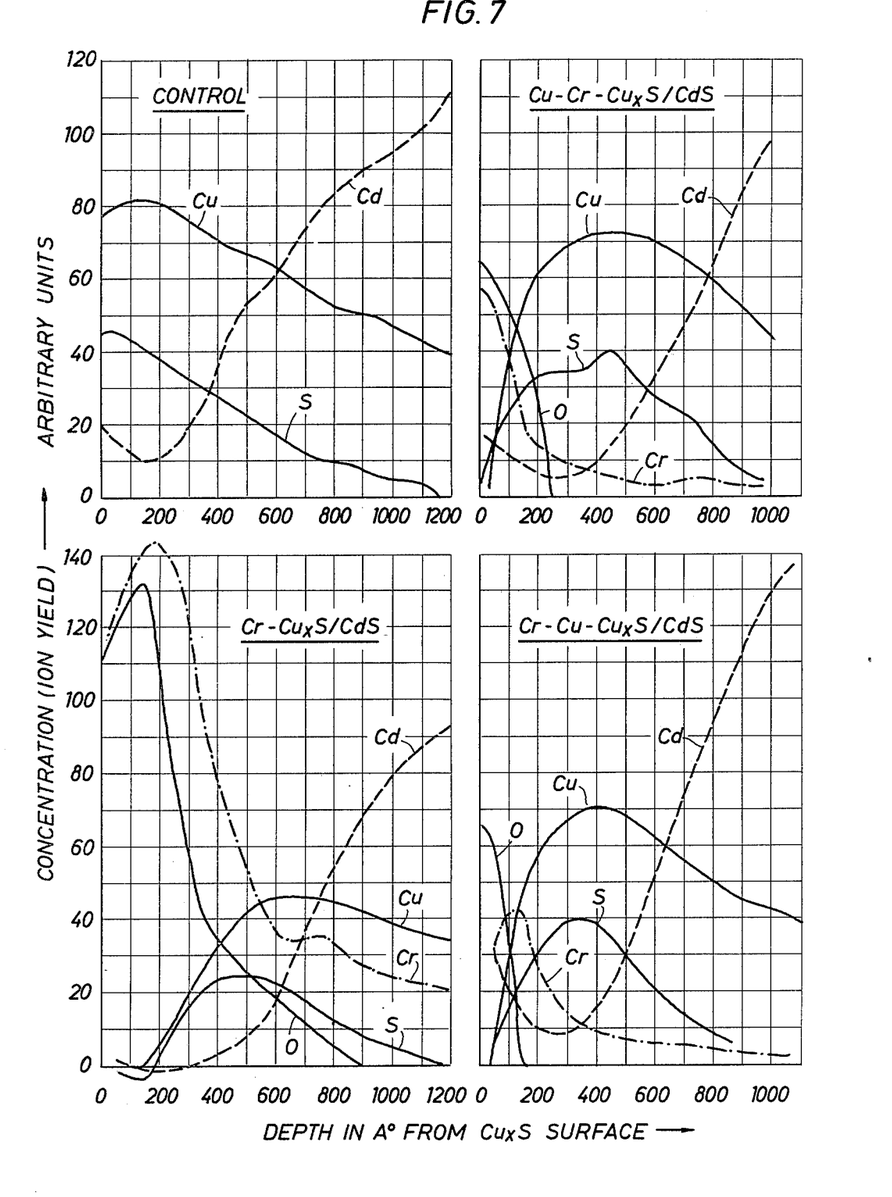
FIG. 7 shows concentration profiles of various elements in cadmium sulfide/copper sulfide/chromium layer.

Metallized (Cr, Cu:Cr and Cr:Cu) Cu$_x$S and controls were depth profiled from the top layer to 2000 Å deep by Ion Scattering Spectroscopy/Secondary Ion Mass Spectroscopy (ISS/SIMS). These samples were prepared according to Process 1. Cr or Cu:Cr were metallized after barrier formation, given a 175° C. heat treatment in air for 8 minutes, a vacuum heat treatment for 20 hours at 195° C., followed by an air heat treatment for 1 hour at 125° C. Concentration profiles of Cu, S, Cd, O and Cr were made by ion-milling the surface every 10 Å layer for the first 200 Å, followed by milling every 100 Å layer and analyzing the secondary ion yield spectra of the above species up to a depth of 2000 Å from the surface (external surface of the chromium-containing layer). FIG. 7 shows the depth profiles up to 1200 Å depth only. These results are summarized below:

(a) Control: there is no apparent oxide layer ($Cu_2O$?) beyond the 20 Å depth from the $Cu_xS$ surface. The oxygen ion yield from the top 10 Å layer could be from surface contaminants or $Cu_2O$ and within the resolution of the instrument; however, this layer cannot be quantified other than the fact that the incoherent $Cu_2O$ layer is not thicker than 10 Å. Up to 75 Å, the Cu:S ion yield ratio is a little less than 2 and beyond the Cu:S ion yield maintains a constant ratio of 2 all the way up to 1200 Å. The interface based on the Cu and Cd concentration profile crossing occurs at 615 Å; the junction, however, extends beyond 2000 Å. The Cd ion yield monatomically decreases across the interface and reaches a minimum at 150 Å, followed by a finite increase near the surface in all cases.

| (b) Cu:Cr | (c) Cr:Cu | (d) Cr |
|---|---|---|
| Oxide layer 240 Å (mainly $Cr_2O_3$) | Oxide layer 170 Å (mainly $Cr_2O_3$) | Oxide Layer 650 Å (mainly $Cr_2O_3$) |
| Cu:S (ion yield ratio) 1 at 50 Å depth and reaches a peak of 2 at 450 Å, maintaining the ratio of 2 all the way up to 1200 Å depth | Cu:S 1 at 50 Å and reaches a peak of 2 around 350 Å | Cu:S at 50 Å and reaches a peak of 2 around 750 Å where $Cu_xS$/CdS interface starts |
| Interface starts around 750 Å | Interface starts around 650 Å | Interface starts around 750 Å |

Both for Cr- and Cu:Cr doped $Cu_xS$, their concentration profiles for O and Cr are parallel with respect to each other up to their corresponding oxide layer thickness. This was not the case on Cr:Cu doped $Cu_xS$, which could be atributed to the way the p-layer was metallized (Cr metallization first, then the vacuum is broken thus forming an instantaneous passive $Cr_2O_3$ layer followed by Cu metallization on top of it). In any event, a finite amount of Cr tail does exist in all three cases, although the chromium exists in the cell as primarily $Cr_2O_3$. The Cr tails segregate preferentially around defect sites and pin them, thus preventing their multiplication and propagation.

(v) Light Induced Chalcocite Decay in Air

Figure 8:
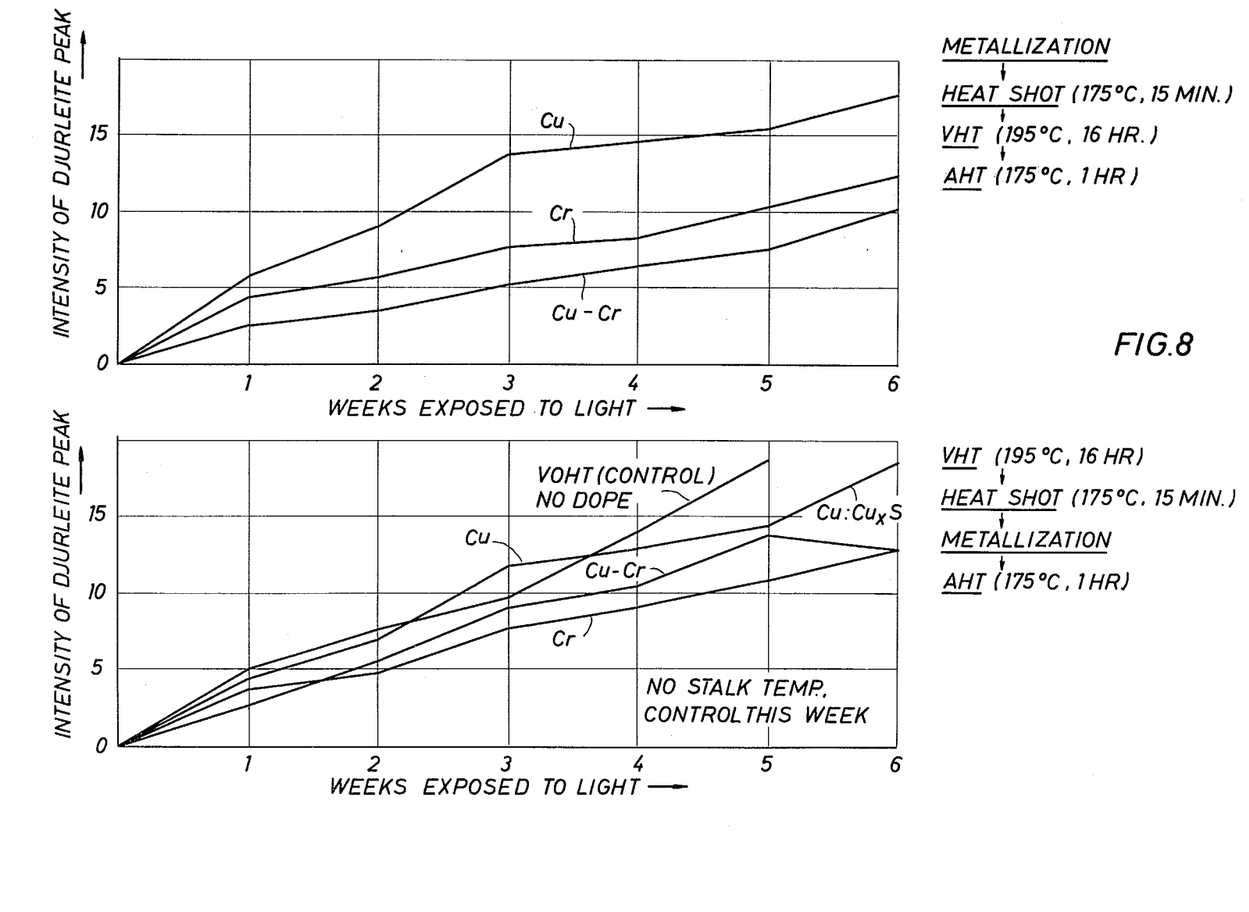
FIG. 8 shows the formation of djurleite in the p-layer at the expense of chalcocite decay as a function of exposure of light in air at 60° C. The formation of djurleite phase correlates positively with cell degradation.

A series of cells were prepared according to the teachings of U.S. Pat. No. 4,127,424. After evaporation of the cadmium sulfide and formation of the copper sulfide barrier layer, the cell was given a vacuum heat treatment at 195° C. for 16 hours, and a heat shot at 175° C. in air for 15 minutes. Then a layer of chromium, a layer of copper or a layer of copper followed by a layer of chromium was vacuum ($4 \times 10^{-6}$ torr) evaporated onto the cell. After this "metallization" the cell was heated in air for 1 hour at 175° C. The cells were then subjected to a test for chalcocite phase stability by subjecting them to a continuous exposure of light (100 mW/cm$^2$) at 60° C. in air. The cells were analyzed by x-ray diffraction to determine the degradation of chalcocite into djurleite by analysis of the relative intensities djurleite [(1.1.11) and (1.0.11)] and chalcocite (1.0.6) Bragg peaks. Results are shown in FIG. 8, which shows the relative intensity of the djurleite peak as a function of light exposure.

Light Induced Chalcocite Decay in Inert Atmosphere

Figure 9:
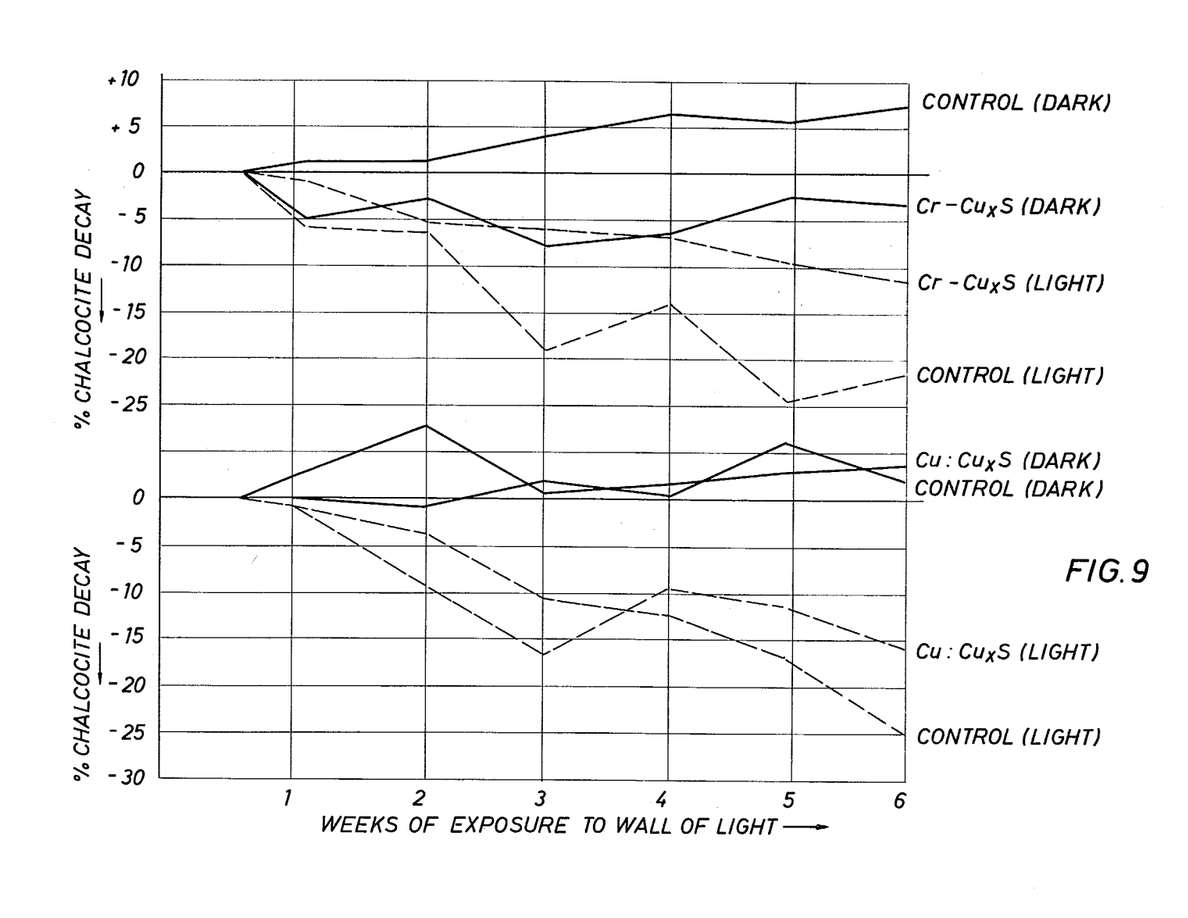
FIG. 9 shows the chalcocite phase decay as a function of exposure of light in nitrogen atmosphere at 60° C., indicating the throttlement of chalcocite decay by chromium metallization of $Cu_xS$.

Halves of Cu:$Cu_xS$/CdS, Cr:$Cu_xS$/CdS and their equivalent $Cu_xS$/CdS controls (prepared by Processes 1 or 2) were subjected to continuous exposure to light (100 mW/cm$^2$); the other halves were kept in the dark for 6 weeks at 60° C. under continuous $N_2$-purging. The second experiment yields the chalcocite decay by light alone compared to the first experiment which combines the effects of light and oxygen. Chalcocite decay based on relative decay of chalcocite (106) with respect to djurleite [(1.1.11) and (1.0.11)] Bragg reflections are shown in FIG. 9. The beauty of Cr-doped $Cu_xS$ compared to control or Bogus-treated $Cu_xS$ in throttling chalcocite decay is self-explanatory.

Observations

1. There is a definite light-induced chalcocite decay when the doped halves in light are compared with other doped halves in the dark. The rate of chalcocite decay is fastest for Cu:$Cu_xS$/CdS or $Cu_xS$/CdS system irrespective of the metallizing/VHT sequence (Process 1 or 2).

2. Metallizing→VHT sequence is better than that of VHT→metallizing (Process 2) sequence in terms of the rate of djurleite rise, which was also confirmed by lifetest data.

3. Cu:Cr-$Cu_xS$ (light) always shows a Cu (111) Bragg peak near the chalcocite (106) indicating a lot of Cu electrotransport near this open-circuit condition (this "Cu" cannot be detected by optical microscope)— which was not detected in either Cu:$Cu_xS$ or Cr:$Cu_xS$ (light) samples.

4. Initial djurleite rise curve for Cr or Cu:Cr doped $Cu_xS$ is fastest for the first week of testing (still much lower than control or Cu:$Cu_xS$), then the rate of the phase degradation becomes substantially smaller compared to control undoped or Cu doped $Cu_xS$/CdS cells.

5. There is not as much difference between Cr and Cu:Cr doped $Cu_xS$ in terms of phase degradation. This is also substantiated by 4 Cu:Cr modules with SCC and efficiency in excess of 15 mA/cm$^2$ and 5.5%, respectively, with wire gridding and packaging holding without any degradation for over 190 days under continuous illumination (85 mW/cm$^2$, AM2-AM3 irradiance). In comparison, similar photocharacteristics of the controls in the same package lost their photooutput long ago.

(vi) Effect of Water on Chalcocite Degradation

A series of cells were prepared as above, with some of the cells metallized with chromium and others left unmetallized (control). The cells were then gridded and sealed in plastic. Cells with similar photo-output were selected for testing. These were subjected to steam at 100° C. for various times. They were then I-V tested (for short-circuit current (SCC) and other photo-output decay) and Bragg scanned (for chalcocite decay, after removing the packaging material). Results are summarized below, which gives the percent djurleite present and the decrease in SCC. Note the SCC decreases as the amount of djurleite increases, and that the presence of chromium retards the djurleite formation.

| Time (Hrs) | % Change SCC Control | % Change SCC Chromium | % Djurleite Present Control | % Djurleite Present Chromium |
|---|---|---|---|---|
| 1 | − 6.7 | − 6.8 | 6.7 | 9.7 |
| 2 | −10.8 | −7.7 | 11.9 | 8.4 |
| 3 | −17.8 | −9.7 | 14.0 | 11.8 |
| 4 | −16.9 | −10.7 | 18.9 | 10.0 |

(vii) Phase Degradation in Air

Cells prepared as in (v) avove show that as long as the copper sulfide layer is metallized with chromium, the chalcocite stability was maintained even after continuous heating in dry air at 175° C. for 125 hours.

Impact of Metallization on Life of $Cu_xS/CdS$ Solar Cells

A. Segments made from chromium metallized halves of $Cu_xS/CdS$ by Process 1 were packaged in the same module with their equivalent nonmetallized control halves and subjected to a continuous illumination (80–85 mW/cm$^2$, and AM2 to AM3 irradiance) at 60° C. under 0.25 V loading conditions for 135 days.

The data were evaluated for degradation of sort circuit current ($I_{sc}$) using a linear regression line to interpolate the decrease in $I_{sc}$ at time t=40 days (from the intercept of the regression line).

| | $<d_{40}>$ | S.D. | $<I_{sco}>$ | S.D. | $<d_{40}>$ | S.D. | $<I\,sco>$ | S.D. |
|---|---|---|---|---|---|---|---|---|
| Metallized (Cr) | − 2.1 | 0.9 | 157.9 | 7.9 | −1.9 | 0.5 | 155.9 | 6.8 |
| Control | −18.1 | 2.8 | 159.1 | 24.4 | −8.9 | 1.1 | 120.1 | 9.0 |

S.D. = Standard Deviation.
$<I_{sco}>$ = Initial Short Circuit Current
$<d_{40}>$ = Degradation in Short Circuit Current.

Since it is generally found that the loss of short-circuit currrent with time is a higher-order function of the initial value of $I_{sc}$ rather than a linear one, the (relative) value of the present change from the initial datum (the intercept if a linear regression is used) will depend on $I_{sco}$. An analysis for the present segments shows that:

(a) The non-metallized segments are degrading more rapidly with increasing $I_{sco}$ than do the Cr-metallized ones.

(b) For the same $I_{sco}$, the Cr-metallization shifts the degradation to lower rates.

B. Packaged modules containing Cr:$Cu_xS$/CdS and Cu:Cr:$Cu_xS$/CdS solar cell segments when compared to their equivalent undoped conrol ($Cu_xS$/CdS) segments under continuos exposure to light (AM1, 100 mW/cm$^2$) at 60° C. on either shorted or 0.25 volts loading conditions show no loss in photo-output in 50 days compared to 0.7% loss in short circuit current per day for nonmetallized $Cu_xS$/CdS cells.

Figure 10:
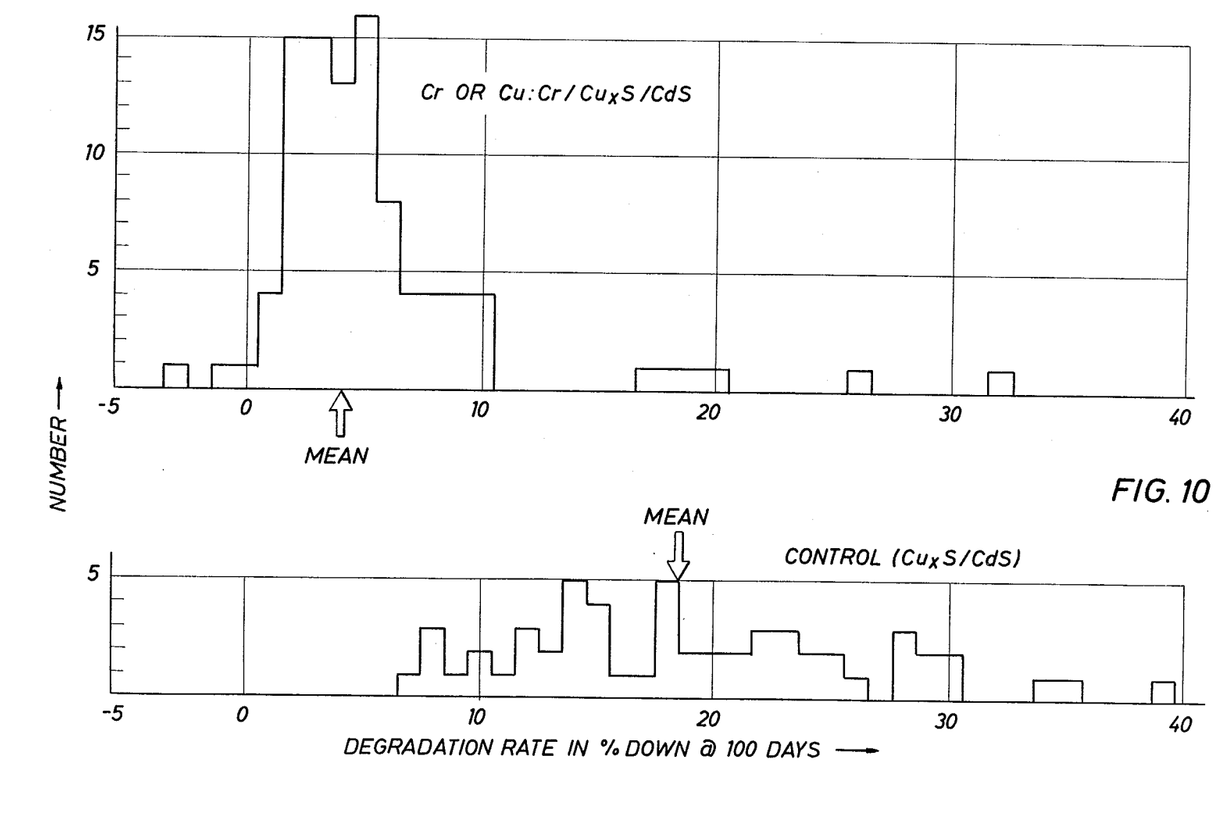
FIG. 10 shows a histogram of the distribution of short circuit current loss rate in nonmetallized $Cu_xS/CdS$ solar cells in Phoenix sunlight (DSET Laboratories) under short circuit or 0.3 V loading, indicating an average loss of 0.187% in SCC loss/day; comparatively x, chromium (with or without copper)/copper sulfide/cadmium sulfide materials show an average loss of 0.04% in SCC loss/day.

C. Lifetime data under field conditions in real sunlight (Desert Sunshine Exposure Test, Inc., Phoenix) under shorted and 0.3 volts loading conditions indicated in (FIG. 10) the dramatic improvements in life (0.04% loss/day) by chromium (with or without copper) metallization of the p-layer when they are compared with equivalent nonmetallized control ($Cu_xS$/CdS solar cells) under the same conditions (0.187% loss/day).

What is claimed is:

1. An improved photovoltaic cell comprising: an electrically conductive first electrode a first film of cadmium sulfide in ohmic contact with said electrode;

a second film of cuprous sulfide in contact with said cadmium sulfide film and forming a p-n junction therewith;

a third film in contact with said cuprous sulfide film and selected from the group consisting of a film comprising chromium, a film comprising chromium having deposited thereon a film comprising copper, a film comprising copper having deposited thereon a film comprising chromium and a film comprising an admixture of chromium and copper and;

an electrically conductive second electrode in ohmic contact with said third film.

2. The cell of claim 1 wherein said third film is a chromium comprising film ranging from about 8 to about 15 angstroms in thickness and said second electrode is a grid-like electrode which allows radiant energy to pass into said third film 3. The cell of claim 1 wherein said third film is a film comprising chromium ranging from about 8 to about 15 angstroms in thickness having deposited thereon a film comprising copper ranging from about 50 to about 100 angstroms in thickness and said second electrode is a grid-like electrode which allows radiant energy to pass into said third film.

4. The cell of claim 1 wherein said third film is a film comprising copper ranging from about 50 to about 100 angstroms in thickness having deposited thereon a film comprising of chromium ranging from about 8 to about 15 angstroms and said second electrode is a grid-like electrode which allows radiant energy to pass through said third film.

5. The cell of claim 1 wherein said third film is a film comprising chromium admixted with copper ranging from about 50 to about 100 angstroms in thickness and said second electrode is a grid-like electrode which allows radiant energy to pass through said third-film.

6. The cell of claim 1 wherein said first electrode is stannic oxide, indium oxide or mixtures thereof ranging in thickness from about $10^3$ to about $2\times10^4$ angstroms and is supported on a substrate transparent to radiant energy.

7. The cell of claim 6 wherein said substrate is glass.

8. In a method for making a photovoltaic cell comprising:

providing an electrically conductive first electrode;

applying a first film of cadmium sulfide to said first electrode;

applying a second film of cuprous sulfide to said first film and forming a p-n junction therewith and;

applying an electrically conductive second electrode thereon; the improvement which comprises applying a third film to said second film before applying said second electrode; said third film being selected from the group consisting of a film comprising chromium, a film comprising chromium having deposited thereon a film comprising copper, a film comprising copper having deposited thereon a film comprising chromium and a film comprising an admixture of chromium and copper.

9. The method of claim 8 wherein said third film is a film comprising chromium applied to a thickness ranging from about 8 to about 15 angstroms and said second electrode is a grid-like electrode which allows radiant energy to pass through said third film.

10. The method of claim 8 wherein said third film is a film comprising chromium applied to a thickness ranging from about 8 to about 15 angstroms having applied thereon a film comprising copper applied to a thickness ranging from about 50 to about 100 angstroms and said second electrode is a grid-like electrode which allows radiant energy to pass through said third film.

11. The method of claim 8 wherein said third film is a film comprising copper applied to a thickness ranging from about 50 to about 100 angstroms having applied thereon a film comprising chromium applied to a thickness ranging from about 8 to about 15 angstroms and said second electrode is a grid-like electrode which allows radiant energy to pass through said third film.

12. The method of claim 8 wherein said third film is a film comprising an admixture of chromium and copper applied to a thickness ranging from about 50 to about 100 angstroms and said top electrode is grid-like electrode which allows radiant energy to pass through said third film.

13. The method of claim 8 wherein said bottom electrode is stannic oxide, indium oxide or mixtures thereof applied to a substrate transparent to radiant energy and to a thickness ranging from about $10^3$ to about $2 \times 10^4$ angstroms, and said third film is applied to a thickness raging from about 10 to about 25 angstroms.

14. The method of any one of claims 8, 9, 10, 11, 12 or 13 wherein said third film is applied by evaporation.

15. The method of any one of claims 8, 9, 10, 11, 12 or 13 wherein said third film is applied chemically.

16. The method of any one of claims 8, 9, 10, 11, 12 or 13 wherein said third film is applied electrolytically.

* * * * *